(12) United States Patent
Ou et al.

(10) Patent No.: US 7,385,226 B2
(45) Date of Patent: Jun. 10, 2008

(54) LIGHT-EMITTING DEVICE

(75) Inventors: Chen Ou, Hsin-Chu (TW); Ting-Yang Lin, Hsin-Chu (TW); Shih-Kuo Lai, Hsin-Chu (TW)

(73) Assignee: Epistar Corporation, Hsin-Chu (TW)

( * ) Notice: Subject to any disclaimer, the term of this patent is extended or adjusted under 35 U.S.C. 154(b) by 27 days.

(21) Appl. No.: 11/160,354

(22) Filed: Jun. 21, 2005

(65) Prior Publication Data

US 2005/0285136 A1 Dec. 29, 2005
US 2008/0054278 A9 Mar. 6, 2008

Related U.S. Application Data

(63) Continuation-in-part of application No. 10/906,458, filed on Feb. 21, 2005.

(30) Foreign Application Priority Data

Mar. 24, 2004 (TW) ................. 093108048
Jun. 24, 2004 (TW) ................. 93118481 A

(51) Int. Cl.
*H01L 33/00* (2006.01)
(52) U.S. Cl. ............... 257/95; 257/91; 257/E33.074
(58) Field of Classification Search ............. 257/91, 257/95, 99, 103, E33.064, E33.065, 98, 745, 257/E33.033, E33.034, E33.043, E33.074
See application file for complete search history.

(56) References Cited

U.S. PATENT DOCUMENTS

| 4,911,102 | A | 3/1990 | Manabe et al. |
|---|---|---|---|
| 5,779,924 | A | 7/1998 | Krames et al. |
| 6,078,064 | A | 6/2000 | Ming-Jiunn et al. |
| 6,504,180 | B1 | 1/2003 | Heremans et al. |
| 6,657,236 | B1 | 12/2003 | Thibeault et al. |
| 2002/0145148 | A1* | 10/2002 | Okuyama et al. ............. 257/88 |
| 2002/0179918 | A1* | 12/2002 | Sung et al. .................... 257/99 |
| 2003/0040167 | A1 | 2/2003 | Nagasawa et al. |
| 2003/0218179 | A1* | 11/2003 | Koide et al. ................... 257/95 |
| 2004/0189184 | A1 | 9/2004 | Yasuda |
| 2005/0211995 | A1 | 9/2005 | Ou et al. |

FOREIGN PATENT DOCUMENTS

| DE | 102 60 937 | 7/2004 |
|---|---|---|
| DE | 10 2005 013 580 A1 | 10/2005 |
| EP | 0 977 280 A2 | 2/2000 |

(Continued)

*Primary Examiner*—Minhloan Tran
*Assistant Examiner*—Benjamin Tzu-Hung Liu
(74) *Attorney, Agent, or Firm*—Quintero Law Office

(57) ABSTRACT

A light-emitting device includes a substrate, a first nitride semiconductor stack formed on the substrate, a nitride light-emitting layer formed on the first nitride semiconductor stack, a second nitride semiconductor stack formed on the nitride light-emitting layer, and a first transparent conductive oxide layer formed on the second nitride semiconductor stack. The second nitride semiconductor stack includes a plurality of hexagonal-pyramid cavities formed in an upper surface of the second nitride semiconductor stack. The plurality of hexagonal-pyramid cavities of the second nitride semiconductor stack are filled with the first transparent conductive oxide layer, and a low-resistance ohmic contact is generated at the inner surfaces of the plurality of hexagonal-pyramid cavities so as to decrease the operation voltage and improve light-emitting efficiency of the light-emitting device.

42 Claims, 10 Drawing Sheets

FOREIGN PATENT DOCUMENTS

| | | |
|---|---|---|
| EP | 1 363 334 A1 | 11/2003 |
| JP | 06-291368 | 10/1994 |
| JP | 10-189480 | 7/1998 |
| JP | 2000-101142 | 4/2000 |
| JP | 2000-244070 | 9/2000 |
| JP | 2002-299769 | 10/2002 |
| JP | 2003-060236 | 2/2003 |
| TW | 144415 | 10/2001 |
| WO | WO 2004/057680 | 7/2004 |

* cited by examiner

| Average depth of hexagonal-pyramid cavities | Thickness of transparent conductive oxide layer | LED operation voltage |
|---|---|---|
| 150nm | 70nm | 3.6V |
| 150nm | 220nm | 3.3V |

Fig. 6

LIGHT-EMITTING DEVICE

This application is a continuation-in-part of U.S. application Ser. No. 10/906,458, filed Feb. 21, 2005.

BACKGROUND OF THE INVENTION

1. Field of the Invention

The present invention relates to a light-emitting device, and more particularly, to a high efficiency light-emitting device.

2. Description of the Prior Art

Semiconductor light-emitting devices have been applied widely in optical display devices, traffic signals, data storing devices, communication devices, illumination devices, and medical apparatuses.

The conventional nitride LED includes a thin metallic layer on a top surface of the LED, such as material of the Ni/Au group, regarded as a transparent conductive layer. However, part of LED light still cannot travel through metal. Light generated by the LED is absorbed by the thin metallic layer and the light transmittance is decreased. In order to have a good transmittance, the thickness of the thin metallic layer is limited to be within several tens to several hundreds of angstroms. Although the thickness of the thin metallic layer is limited, the thin metallic layer merely has transmittance of visible light in the range of 60%~70%, and the light-emitting efficiency of the LED is still low.

U.S. Pat. No. 6,078,064, which is included herein by reference, discloses an LED structure. The surface of LED includes a transparent conductive oxide layer formed on a p-type contact layer of a high carrier concentration. Generally, the transparent conductive oxide layer has a high transmittance of more than 90%. Therefore, the thickness of such layer can be thicker and the current spreading is better, such that the brightness and light-emitting efficiency of the LED are improved. Note that the transparent conductive oxide layer must contact with the p-type contact layer of a high carrier concentration more than $5 \times 10^{18}$ cm$^{-3}$, so as to form a better ohmic contact.

Taiwan Patent No. 144,415, which is incorporated herein by reference, discloses a method for forming a reverse tunneling layer. An N+ reverse tunneling contact layer is formed between a transparent oxide electrode layer and a semiconductor light-emitting layer to achieve the purpose of forming a good ohmic contact so as to improve the light-emitting efficiency of the LED and decrease the operation voltage.

In addition, Y. C. Lin also disclosed a related method in the paper "InGaN/GaN Light Emitting Diodes with Ni/Au, Ni/ITO and ITO p-Type Contacts" (Solid-State Electronics Vol. 47 Page 849-853). He disclosed that a thin metallic layer was formed on a p-type contact layer of a nitride LED, and then a transparent conductive oxide layer was formed on the thin metallic layer. This method can efficiently reduce the contact resistance between the p-type contact layer and the transparent conductive oxide layer. However, the transmittance is still decreased by the thin metallic layer and thus the light-emitting efficiency of the LED is still affected by the thin metallic layer.

Therefore, the present invention aims to improve the brightness of an LED, to solve the contact resistance issue occurring between such a contact layer and transparent conductive oxide layer, and to simplify the process complexity.

SUMMARY OF THE INVENTION

It is therefore an object of the claim invention to provide a light-emitting device with high transmittance to solve the above-mentioned problems.

The claimed invention discloses a light-emitting device. The light-emitting includes a substrate, a first nitride semiconductor stack formed on the substrate, a nitride light-emitting layer formed on the first nitride semiconductor stack, a second nitride semiconductor stack formed on the nitride light-emitting layer having a plurality of hexagonal-pyramid cavities on the surface of the second nitride semiconductor layer opposite to the nitride light-emitting layer, wherein the hexagonal-pyramid cavity extends downward from the surface of the second nitride semiconductor layer, and a first transparent conductive oxide layer formed on the second nitride semiconductor stack. The plurality of hexagonal-pyramid cavities of the second nitride semiconductor stack are filled with the first transparent conductive oxide layer, such that a low-resistance ohmic contact is generated between the transparent conductive oxide layer and the inner surfaces of the plurality of hexagonal-pyramid cavities.

In general, if the second nitride semiconductor stack is p-type material and its surface opposite to the nitride light-emitting layer is flat smooth, and parallel to the substrate surface, the transparent conductive oxide layer cannot directly form a good ohmic contact with the p-type nitride semiconductor stack and thereby increases the operation voltage.

In contrast, the claimed invention provides a plurality of hexagonal-pyramid cavities in the surface of the p-type nitride semiconductor stack opposite to the nitride light-emitting layer, wherein the hexagonal-pyramid cavity extends downward from the surface of the second nitride semiconductor layer, and then forms a transparent conductive oxide layer over the surface, wherein the transparent conductive oxide layer contacts not only the flat region of the surface of the p-type nitride semiconductor without cavity area (hereinafter "flat outer surface"), but also the inner surfaces of the hexagonal-pyramid cavities (below called "cavity inner surface"). The surface energy state of the flat outer surface differs from that of the cavity inner surfaces. The difference between the surface energy states is contributed by the difference of the crystal directions as well as the difference in the surface energy potential between the flat outer surface and the cavity inner surfaces. If the transparent conductive oxide layer is directly formed on the flat outer surface of the p-type nitride semiconductor stack, the interface between the transparent conductive oxide layer and the flat outer surface has a higher potential barrier leading to a higher contact resistance. However, when the transparent conductive oxide layer contacts with the cavity inner surfaces, since the lower potential barrier between interface of the cavity inner surface and the transparent conductive oxide layer, a good ohmic contact can be formed. Therefore, the p-type layer does not need a high carrier concentration as mentioned in the previous prior art. The operation voltage of the device can be reduced to the level as the conventional Ni/Au based LED.

When operation current is applied, current is first spread through the transparent conductive oxide layer, then flowing into the p-type nitride semiconductor stack mainly through the lower resistance contact area of the cavity inner surfaces contacting with the transparent conductive oxide layer, and finally flowing to the light-emitting layer to generate light.

Furthermore, the other advantages of the claimed invention of the hexagonal-pyramid cavities are that the hexagonal-pyramid cavities can effectively reduce both the total reflection effect on the device surface and the light absorption effect of the p-type nitride semiconductor stack. Thus the light-emitting efficiency can be further enhanced. Besides, the light transmittance of the transparent conductive oxide layer is better than that of the conventional thin metallic layer. Constantly, the claimed invention can greatly improve the light-emitting efficiency of the device and can provide the device a low operation voltage.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 6 is a table of average depth of the hexagonal-pyramid cavities, thickness of the transparent conductive oxide layer, and operation voltage.

DETAILED DESCRIPTION

Figure 1:
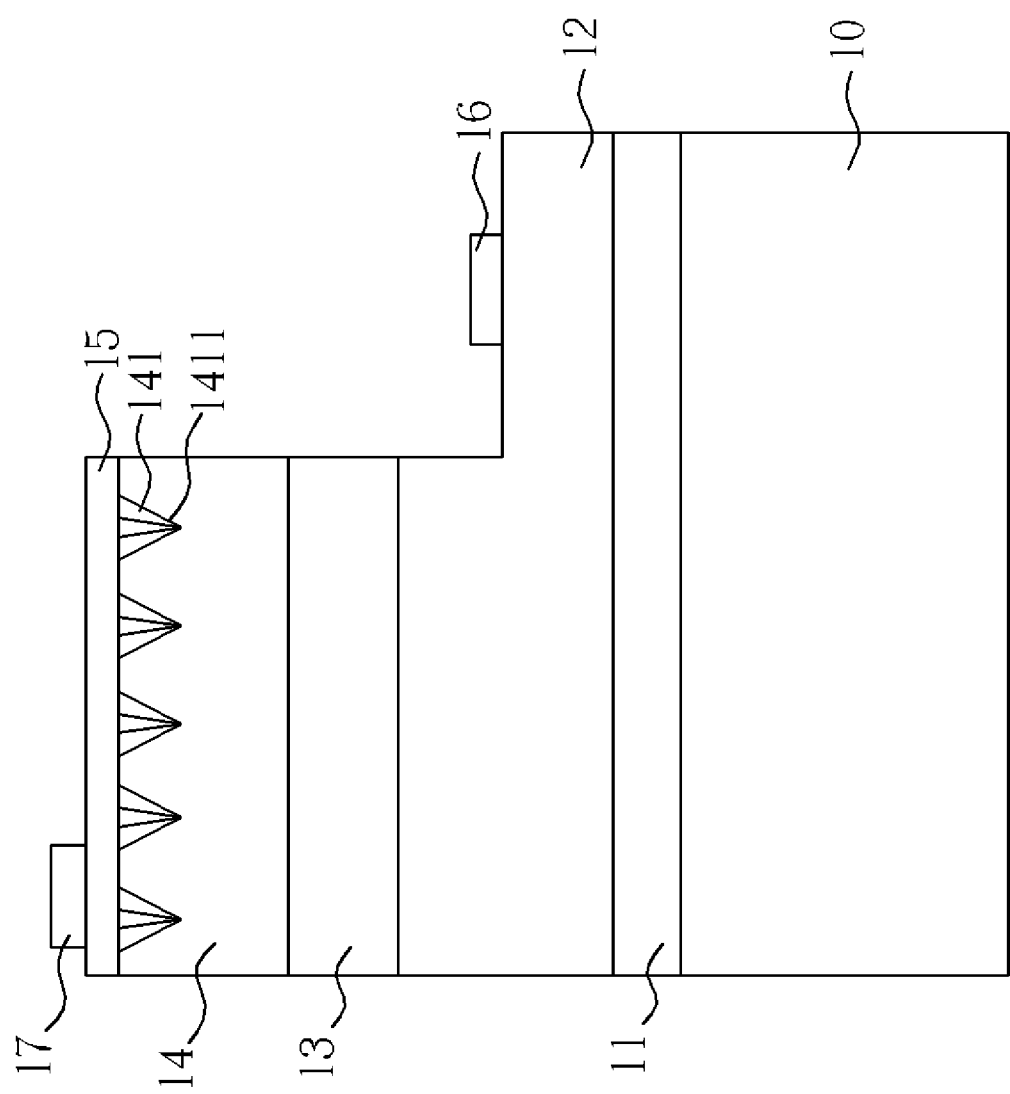
FIG. 1 is a diagram of a first embodiment of the light-emitting device according to the present invention.
Figure 2:
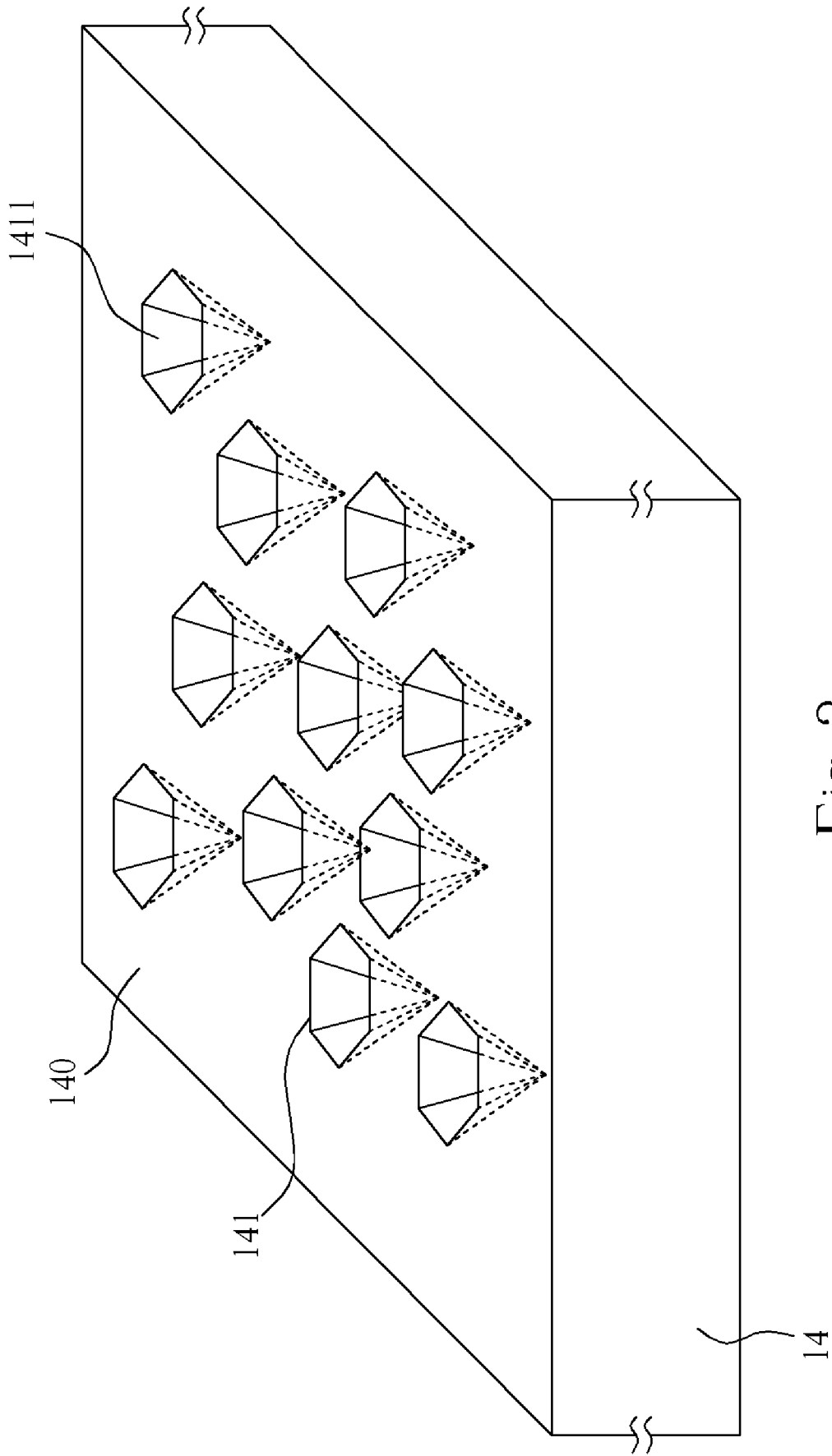
FIG. 2 is a diagram of a p-type nitride semiconductor stack of a plurality of hexagonal-pyramid cavities according to the present invention.

Please refer to FIG. 1, which is a diagram of a light-emitting device based on the present invention. The light-emitting device includes a sapphire substrate 10; a nitride buffer layer 11 formed on the sapphire substrate 10; an n-type nitride semiconductor stack 12 formed on the nitride buffer layer 11, wherein the surface of the n-type nitride semiconductor stack 12 far from the substrate includes a first surface and a second surface; a nitride multiple quantum-well structure light-emitting layer 13 formed on the first surface of the nitride multiple quantum-well structure light-emitting layer 13; a p-type nitride semiconductor stack 14 formed on the nitride multiple quantum-well structure light-emitting layer 13, wherein the surface of the p-type nitride semiconductor stack 14 far from the nitride multiple quantum-well structure light-emitting layer 13 includes a plurality of hexagonal-pyramid cavities 141; a transparent conductive oxide layer 15 formed over the p-type nitride semiconductor stack 14 and the hexagonal-pyramid cavities 141, wherein the material of the transparent conductive oxide layer 15 contacts the cavity inner surfaces 1411; an n-type electrode 16 formed on the second surface of the n-type nitride semiconductor stack 12; and a p-type electrode 17 formed on the transparent conductive oxide layer 15. FIG. 2 is a diagram of the p-type nitride semiconductor stack 14 having the plurality of hexagonal-pyramid cavities 141.

The contact resistance formed between cavity inner surfaces 1411 and the transparent conductive oxide layer 15 is lower than the contact resistance formed between the flat outer surface 140 of the p-type nitride semiconductor stack 14 and the transparent conductive oxide layer 15.

The shape and angle of the hexagonal-pyramid cavities 141 structures depend on the physical crystal property of nitride, such as the crystal property of nitride. Take C-(0001) sapphire substrate for example. Each angle between each adjacent pyramid surface is about 120 degrees substantially, and the pyramid surfaces includes a (10-11) or (11-22) lattice surface group.

The method for forming the hexagonal-pyramid cavities 141 includes at least one step or more than one step, as shown in the following.

1. Surfactant, such as Si or Mg, can be provided for transforming the crystal nucleation of the hexagonal-pyramid cavities 141 so as to form the hexagonal-pyramid cavities 141 on the surface of the p-type nitride semiconductor stack 14 or inside the p-type nitride semiconductor stack 14 when the initial layers of the hexagonal-pyramid cavities 141 grow.

2. The initial layers of the hexagonal-pyramid cavities 141 grow between the epitaxial temperature 700° C. and 950° C. for transforming the crystal nucleation so as to form the hexagonal-pyramid cavities 141 on the surface of the p-type nitride semiconductor stack 14 or inside the p-type nitride semiconductor stack 14.

3. The initial layers of the hexagonal-pyramid cavities 141 grow in a rich nitrogen ambiance for transforming the crystal nucleation so as to form the hexagonal-pyramid cavities 141 on the surface of the p-type nitride semiconductor stack 14 or inside the p-type nitride semiconductor stack 14.

4. After the p-type nitride semiconductor stack 14 is formed, the surface of the p-type nitride semiconductor stack 14 can be etched by performing a chemical wet etching process, such as with high temperature $H_3PO_4$, to form the hexagonal-pyramid cavities 141.

5. A smaller hexagonal-pyramid cavity can be formed first by epitaxial growth. After that, a larger hexagonal-pyramid cavity 141 can be formed by performing a chemical wet etching process on the smaller hexagonal-pyramid cavity, so as to improve the light-emitting efficiency. If the hexagonal-pyramid cavity 141 is formed by epitaxial growth directly, stress can occur on the edge of the hexagonal-pyramid cavity 141 so that an epitaxial defect occurs to decrease the epitaxial quality and affect the electrical properties of the LED. However, if the smaller hexagonal-pyramid cavity is formed first by epitaxial growth and then etched by a chemical wet etching process so as to make the smaller size hexagonal-pyramid cavity larger and deeper, this could avoid a damage of the hexagonal-pyramid cavity 141 epitaxial layers.

Figure 3:
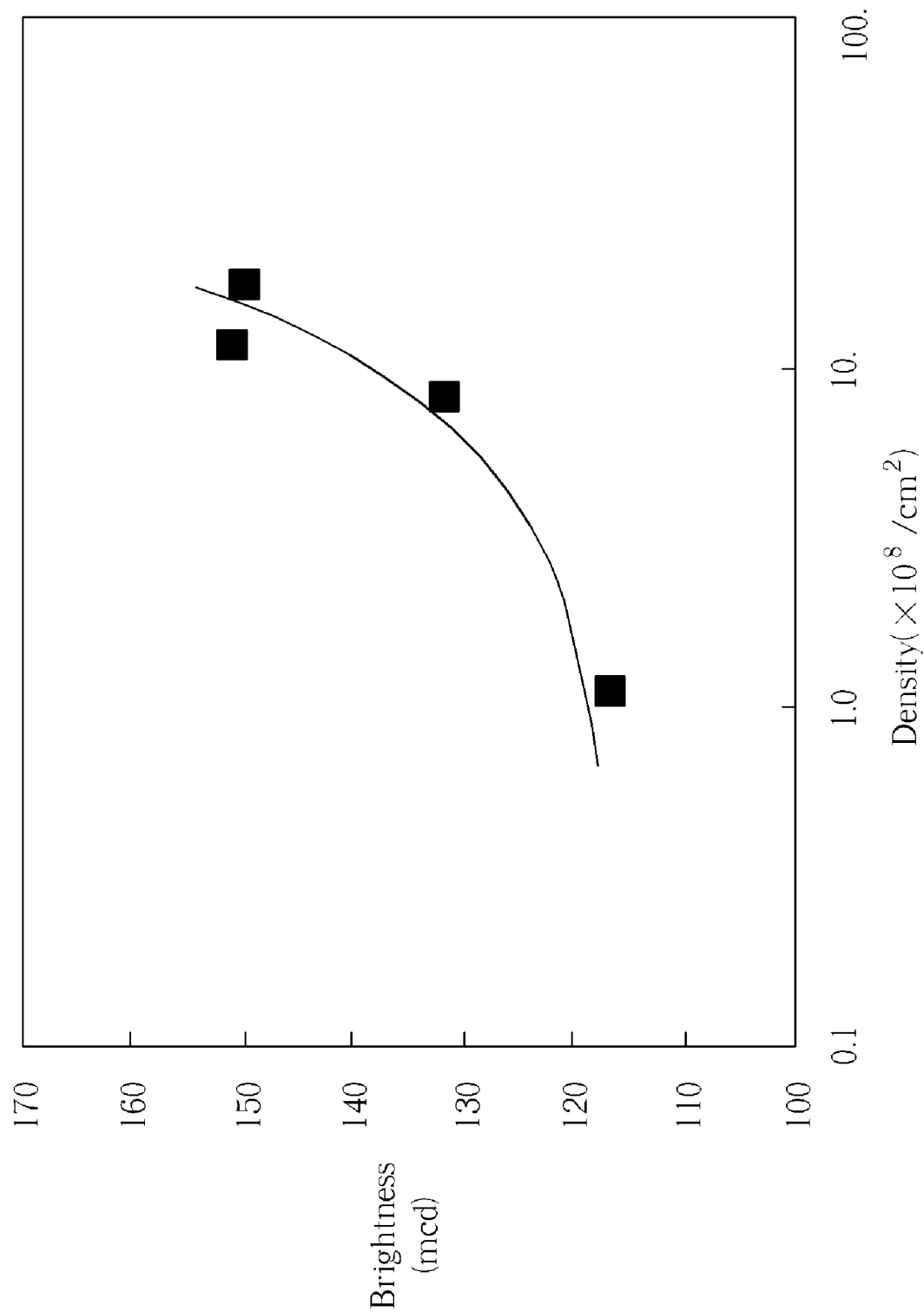
FIG. 3 is a graph of brightness of the present invention light-emitting device vs. density of the hexagonal-pyramid cavities.

The density of the present invention hexagonal-pyramid cavities 141 can be within the range of $1 \times 10^7$ cm$^{-2}$ to $1 \times 10^{11}$ cm$^{-2}$. Please refer to FIG. 3, which shows the best density range of the present invention hexagonal-pyramid cavities 141. From FIG. 3, when the density of the hexagonal-pyramid cavities 141 increases from $1 \times 10^8$ cm$^{-2}$ to $2 \times 10^9$ cm$^{-2}$, the brightness increases from 117 mcd to 150 mcd. This indicates that increasing the density of the hexagonal-pyramid cavities 141 can improve the brightness of the LED.

Figure 4:
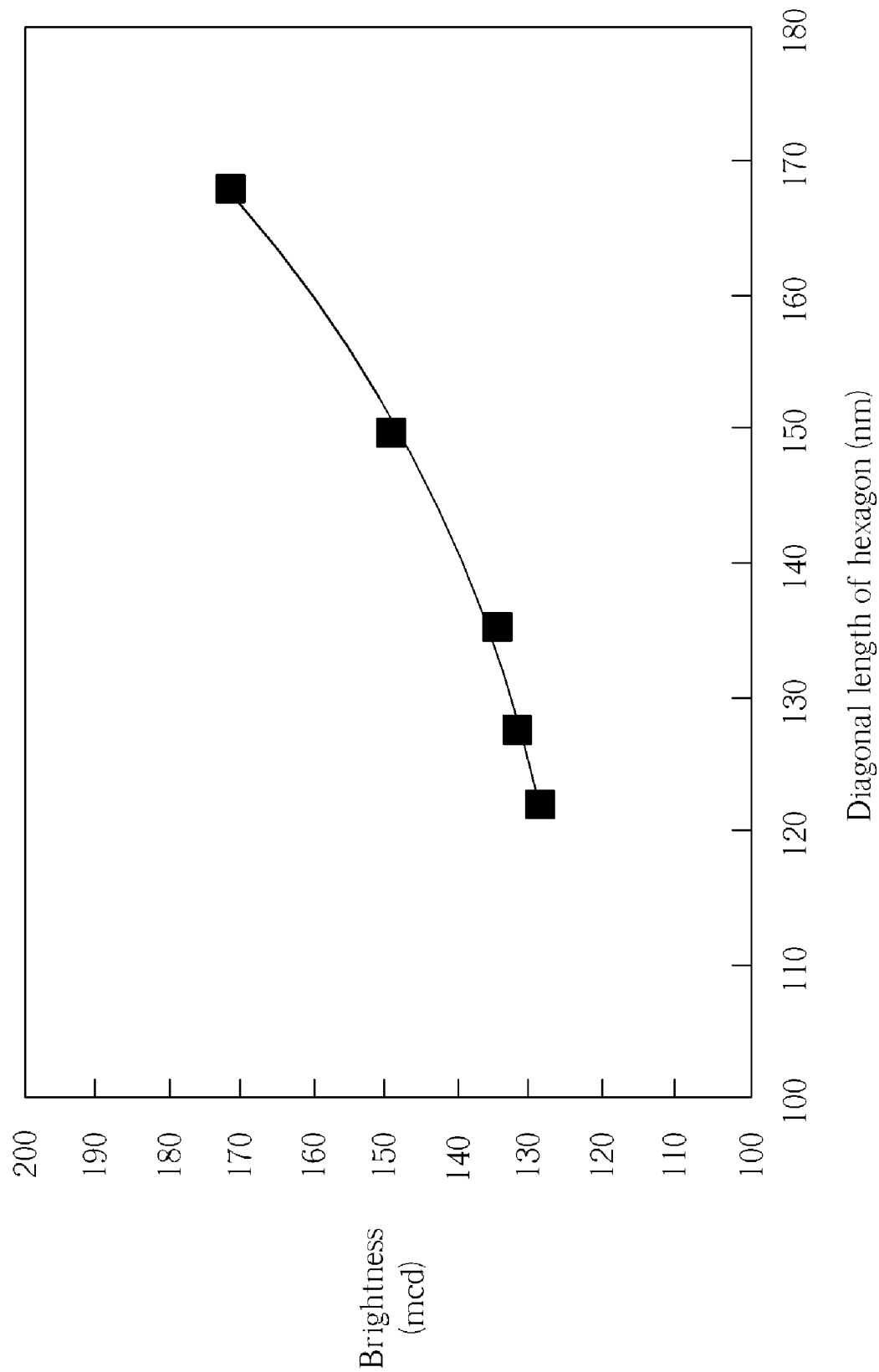
FIG. 4 is a graph of brightness of the present invention light-emitting device vs. diagonal length of hexagonal-pyramid cavities.

The diagonal length of the upper side of the hexagonal-pyramid cavity 141 is within the range of 10 nm to 1 μm. Please refer to FIG. 4, which shows the best range of the diagonal length of the hexagonal-pyramid cavity 141. From FIG. 4, when the diagonal length of the hexagonal-pyramid cavity 141 increases from 122 nm to 168 nm, the brightness can increase from 128 mcd to 173 mcd, which implies a larger hexagonal-pyramid cavity betters the brightness of the LED.

Figure 5:
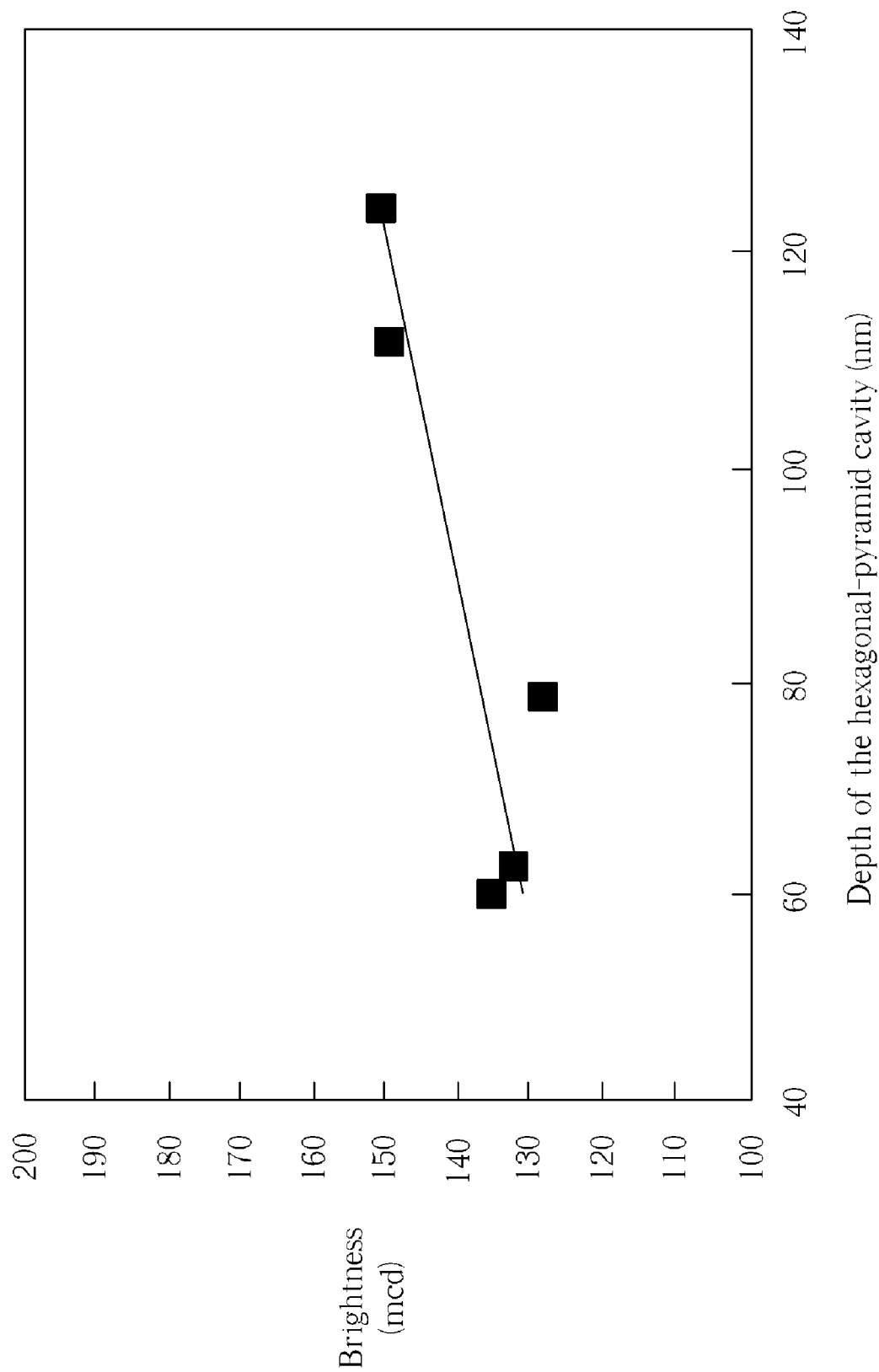
FIG. 5 is a graph of brightness of the present invention light-emitting device vs. depth of hexagonal-pyramid cavities.

The depth of the present invention hexagonal-pyramid cavities 141 can be within the range of 10 nm to 1 μm. Please refer to FIG. 5, which shows the best range of the depth of the hexagonal-pyramid cavities 141. From FIG. 5, when the depth of the hexagonal-pyramid cavity 141 increases from 60 nm to 125 nm, the brightness increases from 130 mcd to 150 mcd. That is, a deeper hexagonal-pyramid cavity 141 can increase the brightness of the LED.

Note that the bottom of the hexagonal-pyramid cavity 141 should be above the light-emitting layer 13. If the bottom of the hexagonal-pyramid cavity 141 extends to the light-emitting layer 13, the electrical properties of the LED would be poor.

Moreover, the transparent conductive oxide layer 15 should be thick enough to fill and cover around the hexagonal-pyramid cavities 141 so that the perimeter of each hexagonal-pyramid cavity 141 contacting with the transparent conductive oxide layer 15 is continuous, not discontinuous or broken. Otherwise, current may not pass into the nitride semiconductor stack 14 through the low resistance contact of the inner surfaces of the hexagonal-pyramid cavities 141 contacting with the transparent conductive oxide layer 15, and thus the operation voltage will be increased.

Please refer to FIG. 6, which is a table of average depth of the hexagonal-pyramid cavities 141, thickness of the transparent conductive oxide layer 15 and operation voltage. This example is a nitride LED having the hexagonal-pyramid cavities 141, which have an average depth of 150 nm. Suppose that different thickness of the transparent conductive oxide layer 15, 70 nm and 220 nm, are respectively formed on the nitride semiconductor stack 14. The operation voltage of an LED with a 70 nm transparent conductive oxide layer 15 is about 3.6V when the current is 20 mA. However, the operation voltage of an LED with a 220 nm transparent conductive oxide layer 15 is about 3.3V in the same condition. This implies that when the thickness of the transparent conductive oxide layer 15 is enough, the operation voltage can be reduced.

The transmittance of the transparent conductive oxide layer 15 is more than 50% when a wavelength of light is within the range of 300 nm to 700 nm. The transparent conductive oxide layer 15 can be formed by an electron beam evaporator, a sputter, a thermal coater, or any combination of such. While forming the transparent conductive oxide layer 15, the best way is to fill the hexagonal-pyramid cavities 141 so that the area of the low resistance contact is increased to efficiently reduce the operation voltage of the LED.

In addition, after the transparent conductive oxide layer 15 fills the hexagonal-pyramid cavities 141, the surface of the transparent conductive oxide layer 15 does not have the property of the hexagonal-pyramid cavities 141. In other words, the refractive index difference of materials below and above the hexagonal-pyramid cavities 141 should be maximized, such that the light-extraction effect can be improved. Therefore, the refractive index of the transparent conductive oxide layer 15 should be between the refractive indexes of nitride material and package material. Preferably, the absolute value of refractive index difference of the transparent conductive oxide layer 15 and the nitride material is higher than that of the transparent conductive oxide layer 15 and the package material.

Figure 7:
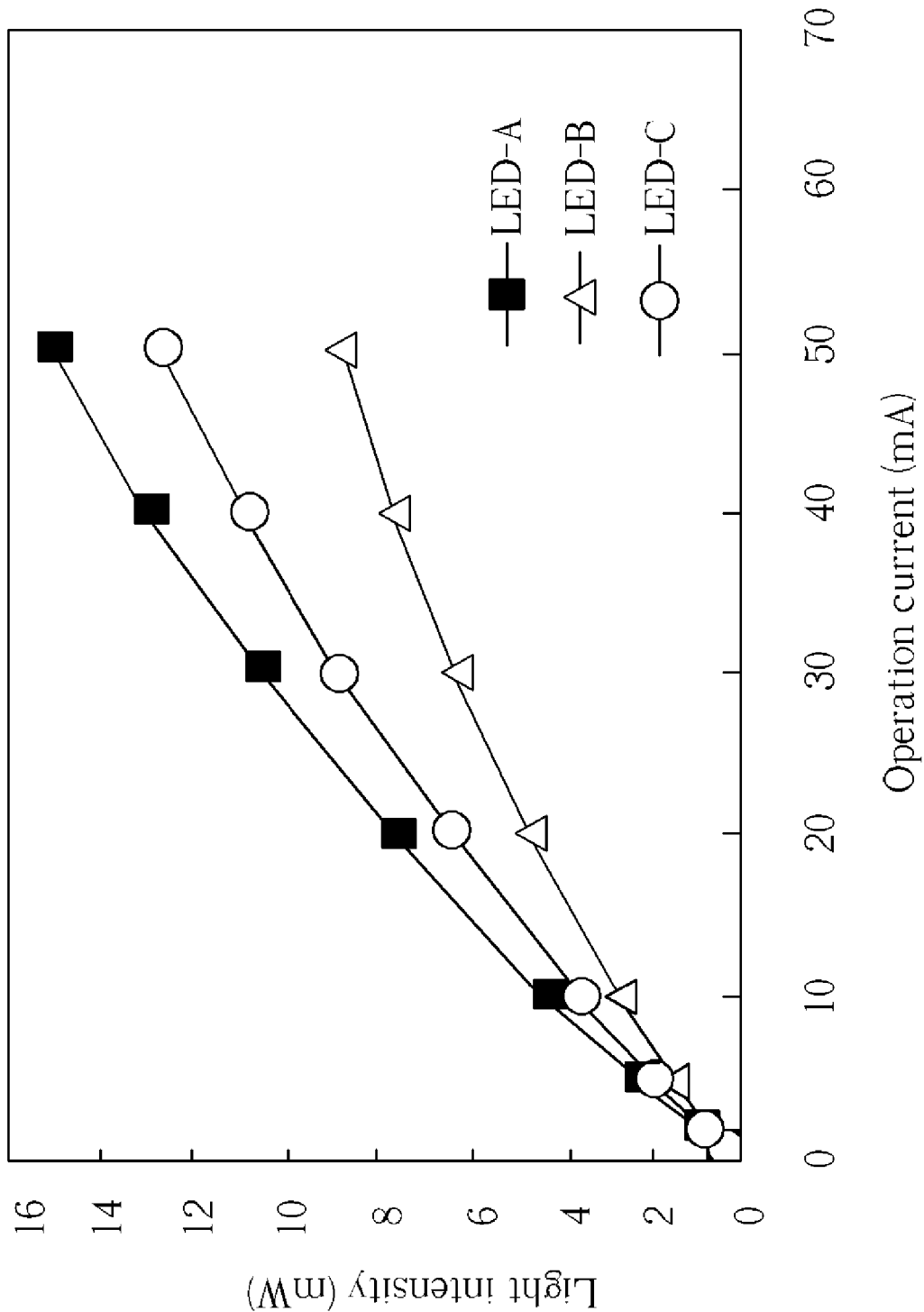
FIG. 7 is a graph of intensity vs. operation current for different LEDs.

FIG. 7 shows a comparison graph of light intensity vs. operation current for three kinds of LEDs, wherein LED-A is an LED having the present invention hexagonal-pyramid cavities 141 and the transparent conductive oxide layer 15, LED-B is an LED having a thin metallic layer but no hexagonal-pyramid cavities 141, and LED-C is an LED having a conductive oxide layer but no hexagonal-pyramid cavities 141. From FIG. 7, LED-B has an imperfect light-emitting property and the brightness is lower because the light transmittance of the thin metallic layer is lower than that of the conductive oxide layer. LED-C, having the conventional thin metallic layer replaced with the transparent conductive oxide layer has excellent light transmittance, and thereby improves the light-emitting effect and enhances the light-emitting efficiency. However, LED-A takes advantage of hexagonal-pyramid cavities 141 to increase total light-emitting area, and reduce light loss caused by the total reflection effect and light absorption of the semiconductor stack over the light-emitting layer. Therefore, LED-A can greatly increase brightness and light-emitting efficiency.

Figure 8:
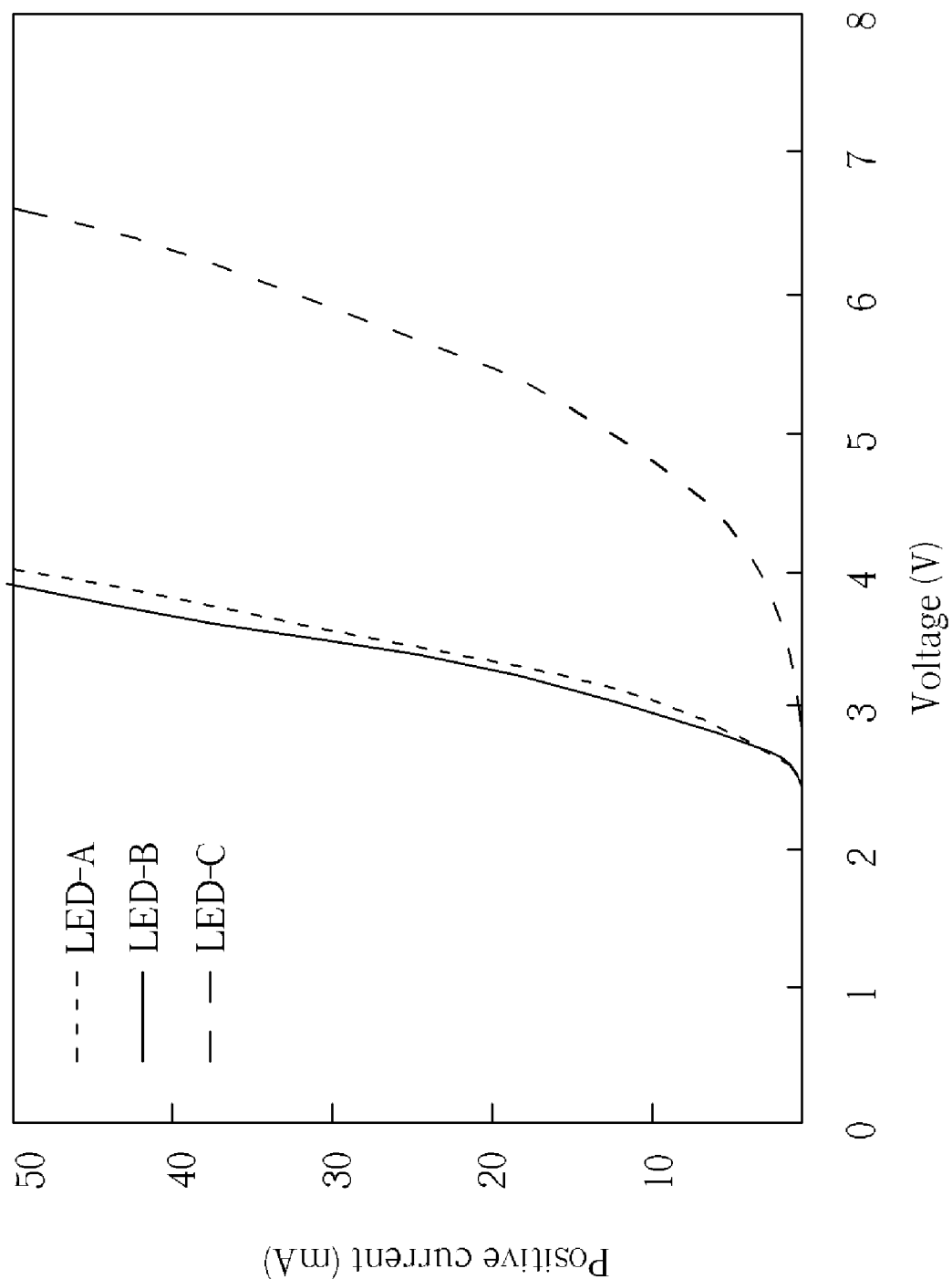
FIG. 8 is a graph of positive current vs. voltage for different LEDs.

FIG. 8 shows a comparison graph of positive current vs. voltage for three kinds of LEDs, wherein LED-A is an LED having the present invention hexagonal-pyramid cavities 141 and the transparent conductive oxide layer 15, LED-B is an LED having a thin metallic layer but no hexagonal-pyramid cavities 141, and LED-C is an LED having a conductive oxide layer but no hexagonal-pyramid cavities 141. From FIG. 8, the operation voltage of LED-B having the thin metallic layer is the lowest one of the three LEDs. Due to imperfect ohmic contact, the operation voltage of LED-C having the conductive oxide layer is very high. For example, when the current is 20 mA, the operation voltage of LED-C is more than 5V. Nevertheless, the operation voltage of the LED-A having the conductive oxide layer and the hexagonal-pyramid cavities 141 can be reduced to similar to that of LED-B. Therefore, the present invention can provide better performance.

Figure 9:
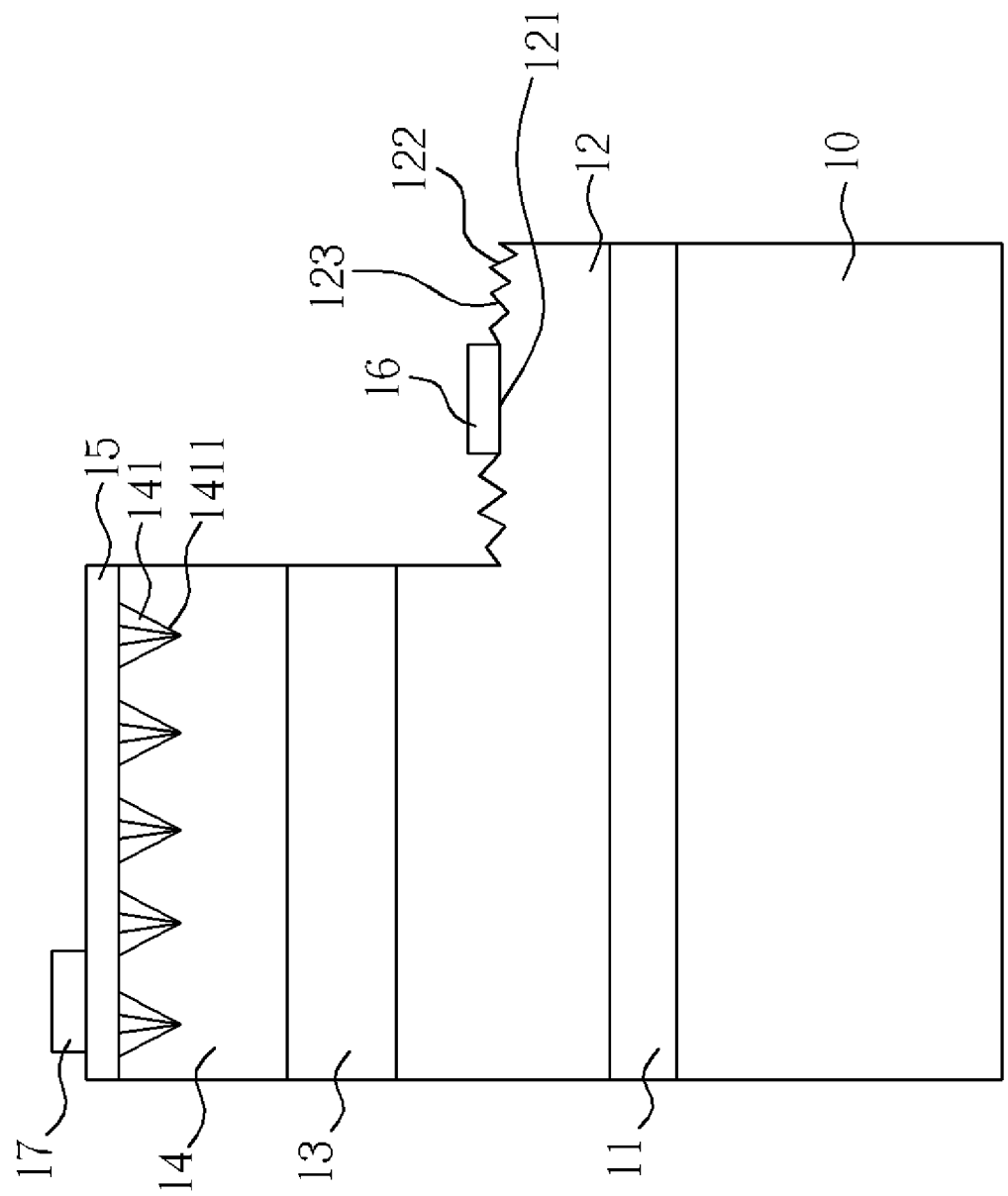
FIG. 9 is a diagram of a second embodiment of the light-emitting device according to the present invention.

Please refer to FIG. 9, which is a diagram of a second embodiment of the light-emitting device according to the present invention. The second surface of the n-type nitride semiconductor stack 12 of the light-emitting device further comprises an n-type electrode contact area 121 and a non-electrode contact area 122. The n-type electrode 16 is formed on the n-type electrode contact area 121. The non-electrode contact area 122 further includes a high-efficiency light-emitting surface. A rough surface or a plurality of hexagonal-pyramid cavities is formed by performing an etching process or epitaxial growth on the high-efficiency light-emitting surface. In this embodiment, the light-emitting device includes a rough surface 123. Because of the rough surface 123 of the non-electrode contact area 122, lateral light reflected between the substrate 10 and the n-type nitride semiconductor stack 12 can be reduced, so that the lateral light can be emitted effectively for increasing the light-emitting efficiency of the LED.

Figure 10:
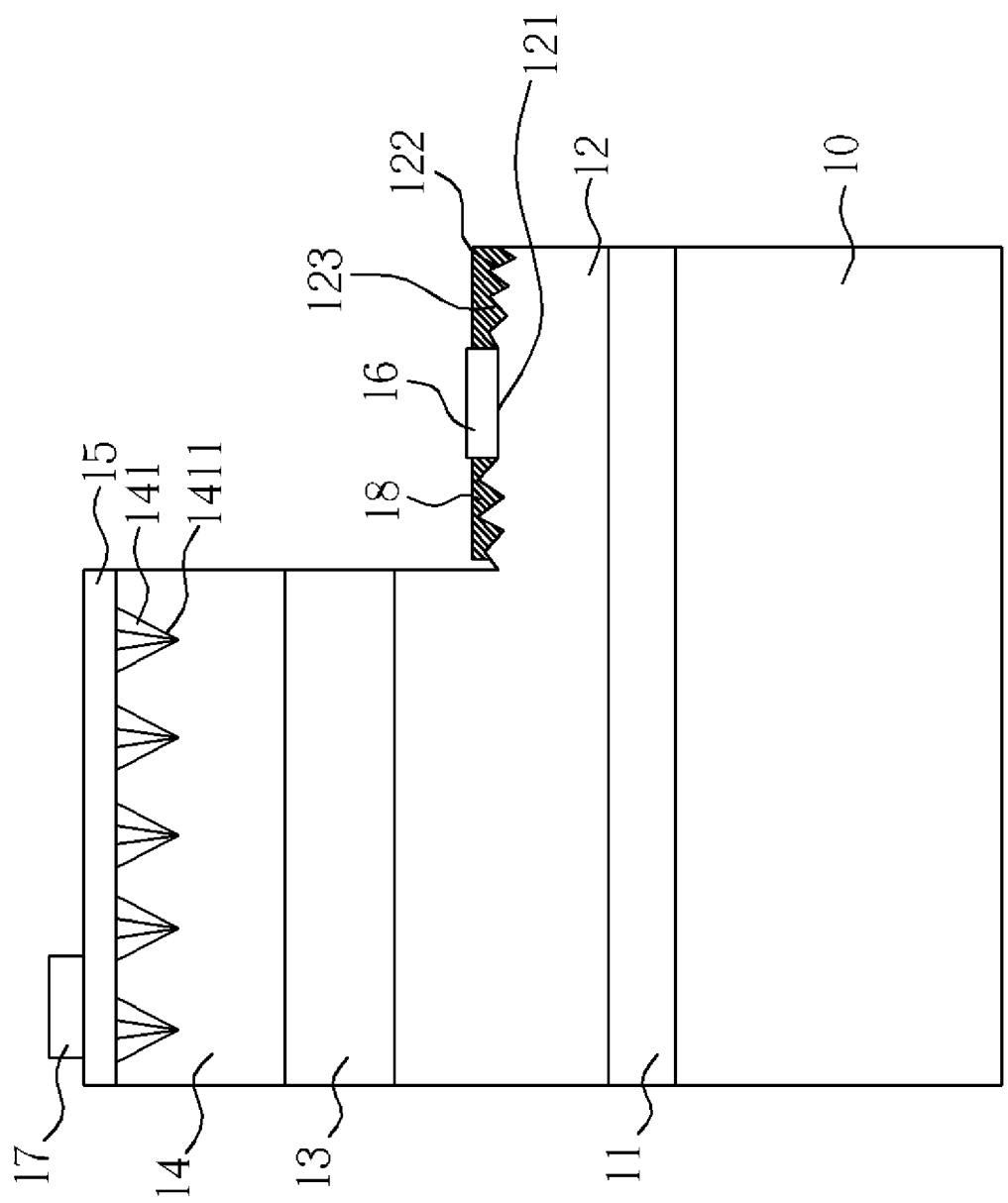
FIG. 10 is a diagram of a third embodiment of the light-emitting device according to the present invention.

Please refer to FIG. 10, which is a diagram of a third embodiment of the light-emitting device according to the present invention. The light-emitting device further comprises a second transparent conductive oxide layer 18 formed on the rough surface 123 and the non-electrode contact area 122; also, the second transparent conductive oxide layer 18 contacts with the n-type electrode 16, such that current spreading at the second transparent conductive oxide layer 18 is better. Moreover, the light-emitting efficiency is improved if the refractive index of the second transparent conductive oxide layer 18 is between the refractive indexes of nitride material and package material.

In the above-mentioned embodiments, a transparent conductive oxide layer can be formed between the n-type electrode 16 and the n-type electrode contact area 121 of the second surface of the n-type nitride semiconductor stack 12.

In the above-mentioned embodiments, the transparent conductive oxide layer can be taken as the n-type electrode.

In the above-mentioned embodiments, the n-type electrode contact area 121 can further include a plurality of hexagonal-pyramid cavities.

In the above-mentioned embodiments, the sapphire substrate 10 has an off angle between 0 and 10 degrees. The sapphire substrate 10 can be substituted by a substrate made of a material selected from a group consisting of GaN, AlN, SiC, GaAs, GaP, Si, ZnO, MgO, MgAl$_2$O$_4$, and glass.

In the above-mentioned embodiments, the nitride buffer layer 11 consists of AlN, GaN, AlGaN, InGaN, and AlInGaN. The n-type nitride semiconductor stack 12 consists of AlN, GaN, AlGaN, InGaN, and AlInGaN. The nitride multiple quantum-well structure light-emitting layer 13 consists of AlN, GaN, AlGaN, InGaN, and AlInGaN. The p-type nitride semiconductor stack 14 consists of AlN, GaN, AlGaN, InGaN, and AlInGaN. The transparent conductive oxide layer 15 and 18 consist of indium tin oxide (ITO), cadmium tin oxide (CTO), antimony tin oxide, indium zinc oxide, zinc aluminum oxide, and zinc tin oxide.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A light-emitting device comprising:
   a substrate;
   a first nitride semiconductor stack formed on the substrate;
   a nitride light-emitting layer formed on the first nitride semiconductor stack in parallel to a surface of the substrate;
   a second nitride semiconductor stack formed on the nitride light-emitting layer, comprising at least one p-type nitride semiconductor layer and a plurality of hexagonal-pyramid cavities extending downward from a surface of the second nitride semiconductor stack opposite to the nitride light-emitting layer; and
   a first transparent conductive oxide layer formed on the plurality of hexagonal-pyramid cavities in a low-resistance ohmic contact.

2. The light-emitting device of claim 1 wherein a diagonal length, in the surface of the second nitride semiconductor stack, of one of the hexagonal-pyramid cavities is within the range of 10 nm to 1 µm.

3. The light-emitting device of claim 1, wherein the density of the hexagonal-pyramid cavities is within the range of $1 \times 10^7$ cm$^{-2}$ to $1 \times 10^{11}$ cm$^{-2}$.

4. The light-emitting device of claim 1, wherein a depth of one of the hexagonal-pyramid cavities is within the range of 10 nm to 1 µm.

5. The light-emitting device of claim 1 further comprising a buffer layer formed between the substrate and the first nitride semiconductor stack.

6. The light-emitting device of claim 1, wherein the first transparent conductive oxide layer comprises at least one material selected from a group consisting of indium tin oxide (ITO), cadmium tin oxide (CTO), antimony tin oxide, indium zinc oxide, zinc aluminum oxide, and zinc tin oxide.

7. The light-emitting device of claim 1, wherein a transmittance of the first transparent conductive oxide layer is more than 50% when a wavelength of light is within the range of 300 nm to 700 nm.

8. The light-emitting device of claim 1, wherein a thickness of the first transparent conductive oxide layer is within the range of 50 nm to 1 µm.

9. The light-emitting device of claim 1, wherein the substrate is a C-(0001) sapphire substrate, an angle between every two adjacent pyramid surfaces of each of the hexagonal-pyramid cavities is substantially 120 degrees, and each of the pyramid surfaces includes a (10-11) or (11-22) lattice surface group.

10. The light-emitting device of claim 1, wherein the substrate is a (0001) or (11-20) sapphire substrate having an off angle from 0 to 10 degrees.

11. The light-emitting device of claim 1, wherein the substrate comprises at least one material selected from a group consisting of GaN, AlN, SiC, GaAs, GaP, Si, ZnO, MgO, MgAl$_2$O$_4$, and glass.

12. The light-emitting device of claim 1, wherein the first nitride semiconductor stack comprises at least one material selected from a group consisting of AlN, GaN, AlGaN, InGaN, and AlInGaN.

13. The light-emitting device of claim 1, wherein the first nitride semiconductor stack comprises at least one n-type nitride semiconductor layer.

14. The light-emitting device of claim 1, wherein the first nitride semiconductor stack comprises at least one p-type nitride semiconductor layer.

15. The light-emitting device of claim 1, wherein the nitride light-emitting layer comprises at least one material selected from a group consisting of AlN, GaN, AlGaN, InGaN, and AlInGaN.

16. The light-emitting device of claim 1, wherein the nitride light-emitting layer includes a double hetero-structure, a single quantum-well structure, or a multiple quantum-well structure.

17. The light-emitting device of claim 1, wherein the second nitride semiconductor stack comprises at least one material selected from a group consisting of AlN, GaN, AlGaN, InGaN, and AlInGaN.

18. The light-emitting device of claim 5, wherein the buffer layer comprises at least one material selected from a group consisting of AlN, GaN, AlGaN, InGaN, and AlInGaN.

19. The light-emitting device of claim 1, wherein the hexagonal-pyramid cavities of the second nitride semiconductor stack are formed by epitaxial growth.

20. The light-emitting device of claim 1, wherein the hexagonal-pyramid cavities of the second nitride semiconductor stack are formed by performing a wet etching process.

21. The light-emitting device of claim 1, wherein the hexagonal-pyramid cavities of the second nitride semiconductor stack are formed by epitaxial growth and performing a wet etching process.

22. The light-emitting device of claim 1, wherein the distance from the bottom of the hexagonal-pyramid cavity to the substrate is not less than the distance from the upper surface of the nitride light-emitting layer to the substrate.

23. The light-emitting device of claim 1, wherein the contact resistance formed at inner surfaces of the hexagonal-pyramid cavities contacting with the first transparent conductive oxide layer is lower than the contact resistance formed at the surface of the second nitride semiconductor stack contacting with the first transparent conductive oxide layer.

24. The light-emitting device of claim 1, wherein the refractive index of the first transparent conductive oxide layer is between the refractive indexes of nitride material and package material.

25. The light-emitting device of claim 1, wherein the surface of the first nitride semiconductor stack far from the substrate includes a first surface and a second surface, the nitride light-emitting layer being formed on the first surface of the first nitride semiconductor stack.

26. The light-emitting device of claim 25 further comprising a second transparent conductive oxide layer formed on the second surface of the first nitride semiconductor stack.

27. The light-emitting device of claim 26, wherein the second transparent conductive oxide layer comprises at least one material selected from a group consisting of indium tin oxide, cadmium tin oxide, antimony tin oxide, indium zinc oxide, zinc aluminum oxide, and zinc tin oxide.

28. The light-emitting device of claim 26, wherein the refractive index of the second transparent conductive oxide layer is between the refractive indexes of nitride material and package material.

29. The light-emitting device of claim 25 wherein the second surface of the first nitride semiconductor stack is a high light extraction efficiency surface.

30. The light-emitting device of claim 29 wherein the high light extraction efficiency surface is formed with a hexagonal-pyramid cavity formed in the high light extraction efficiency surface.

31. The light-emitting device of claim 30, wherein a second transparent conductive oxide layer is formed on the second surface of the first nitride semiconductor stack that is formed with the hexagonal-pyramid cavities.

32. The light-emitting device of claim 31, wherein each of the hexagonal-pyramid cavities of the first nitride semiconductor stack is substantially filled with the second transparent conductive oxide layer.

33. The light-emitting device of claim 30, wherein a diagonal length, in the surface of the second nitride semiconductor stack, of one of the hexagonal-pyramid cavities is within the range of 10 nm to 1 μm.

34. The light-emitting device of claim 30, wherein a density of the hexagonal-pyramid cavities is within the range of $1 \times 10^7 \, \text{cm}^{-2}$ to $1 \times 10^{11} \, \text{cm}^{-2}$.

35. The light-emitting device of claim 30, wherein a depth of the hexagonal-pyramid cavity is within the range of 10 nm to 1 μm.

36. The light-emitting device of claim 30, wherein the hexagonal-pyramid cavities are formed by performing a wet etching process.

37. The light-emitting device of claim 31, wherein the second transparent conductive oxide layer comprises at least one material selected from a group consisting of indium tin oxide, cadmium tin oxide, antimony tin oxide, indium zinc oxide, zinc aluminum oxide, and zinc tin oxide.

38. The light-emitting device of claim 29, wherein the high light extraction efficiency surface is formed with a rough structure.

39. The light-emitting device of claim 38, wherein a second transparent conductive oxide layer is formed on the second surface of the first nitride semiconductor stack that is formed with the rough structure.

40. The light-emitting device of claim 39, wherein the second transparent conductive oxide layer comprises at least one material selected from a group consisting of indium tin oxide, cadmium tin oxide, antimony tin oxide, indium zinc oxide, zinc aluminum oxide, and zinc tin oxide.

41. The light-emitting device of claim 38, wherein the rough structure is formed by performing a wet etching process.

42. The light-emitting device of claim 31, wherein the refractive index of the second transparent conductive oxide layer is between the refractive indexes of nitride material and package material.

* * * * *